(12) United States Patent
Hirst et al.

(10) Patent No.: US 8,767,482 B2
(45) Date of Patent: Jul. 1, 2014

(54) APPARATUSES, DEVICES AND METHODS FOR SENSING A SNAPBACK EVENT IN A CIRCUIT

(75) Inventors: Jeremy Hirst, Orangevale, CA (US); Hernan Castro, Shingle Springs, CA (US); Stephen Tang, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 13/213,018

(22) Filed: Aug. 18, 2011

(65) Prior Publication Data

US 2013/0044539 A1 Feb. 21, 2013

(51) Int. Cl.
*G11C 7/00* (2006.01)

(52) U.S. Cl.
USPC ............. 365/189.07; 365/189.09; 365/189.14

(58) Field of Classification Search
USPC ................... 365/148, 189.07, 189.09, 189.15
See application file for complete search history.

(56) References Cited

U.S. PATENT DOCUMENTS

| | | | |
|---|---|---|---|
| 6,965,504 B2 * | 11/2005 | Liu et al. ........................ | 361/58 |
| 7,701,758 B2 | 4/2010 | Nakai | |
| 7,864,607 B2 | 1/2011 | Patel et al. | |
| 7,876,607 B2 | 1/2011 | Tang | |
| 2006/0002173 A1 * | 1/2006 | Parkinson et al. ............ | 365/148 |
| 2006/0157679 A1 | 7/2006 | Scheuerlein | |
| 2006/0278900 A1 * | 12/2006 | Chang et al. .................. | 257/248 |
| 2009/0285016 A1 | 11/2009 | Bedeschi et al. | |
| 2010/0149856 A1 * | 6/2010 | Tang ............................. | 365/163 |
| 2010/0156506 A1 | 6/2010 | Tsuzuki et al. | |
| 2010/0246237 A1 | 9/2010 | Borot et al. | |

OTHER PUBLICATIONS

International Search Report dated Dec. 26, 2012 in corresponding PCT Application No. PCT/US2012/051489.

* cited by examiner

*Primary Examiner* — Hoai V Ho
(74) *Attorney, Agent, or Firm* — Knobbe, Martens, Olson & Bear, LLP

(57) ABSTRACT

Example subject matter disclosed herein relates to apparatuses and/or devices, and/or various methods for use therein, in which an application of an electric potential to a circuit may be initiated and subsequently changed in response to a determination that a snapback event has occurred in a circuit. For example, a circuit may comprise a memory cell that may experience a snapback event as a result of an applied electric potential. In certain example implementations, a sense circuit may be provided which is responsive to a snapback event occurring in a memory cell to generate a feed back signal to initiate a change in an electric potential applied to the memory cell.

12 Claims, 3 Drawing Sheets ially (PCMS) memory cell.

APPARATUSES, DEVICES AND METHODS FOR SENSING A SNAPBACK EVENT IN A CIRCUIT

BACKGROUND

1. Field

Subject matter disclosed herein relates to memory devices and, more particularly, to apparatuses, devices, and methods for sensing a snapback event of a circuit.

2. Information

A memory device may comprise a plurality of memory cells. For example, a plurality of memory cells may be arranged in an array configuration and/or a stacked configuration. A memory device may also comprise an interface that may be used, for example, in accessing a memory cell. For example, an interface may access a memory cell to determine a programmed state of the memory cell, e.g., as part of a READ operation. For example, an interface may access a memory cell to establish a programmed state in the memory cell, e.g., as part of a WRITE operation. An interface may, for example, be coupled to one or more other circuit devices (e.g., a processor, a transceiver, etc.), which may use a memory device.

In certain example instances, a memory device may be provided as a separate component (e.g., chip, semiconductor die, etc.) which may be coupled to other circuit devices. In certain other instances, a memory device may be provided along with one or more other circuit devices, for example, as part of multiple chip package, one or more semiconductor dies, a system on a chip, just to name a few.

In certain instances, a memory device may comprise a phase change memory (PCM). In certain instances, a memory cell may comprise PCM component (e.g., a chalcogenic component such as an ovonic memory switch (OMS), etc.) and a selection component (e.g., a threshholding component such as an ovonic threshold switch (OTS)). Such a memory cell may, for example, be referred to as a PCM and Switch (PCMS) memory cell.

BRIEF DESCRIPTION OF THE FIGURES

Non-limiting and non-exhaustive implementations will be described with reference to the following figures, wherein like reference numerals refer to like parts throughout the various figures unless otherwise specified.

DETAILED DESCRIPTION

Reference throughout this specification to "one implementation", "an implementation", or "certain implementations" means that a particular feature, structure, or characteristic described in connection with a described implementation(s) may be included in at least one implementation of claimed subject matter. Thus, appearances of the phrase "in one example implementation", "in an example implementation", or "in certain example implementations" in various places throughout this specification are not necessarily all referring to the same implementation(s). Furthermore, particular features, structures, or characteristics may be combined in one or more implementations.

Figure 1:
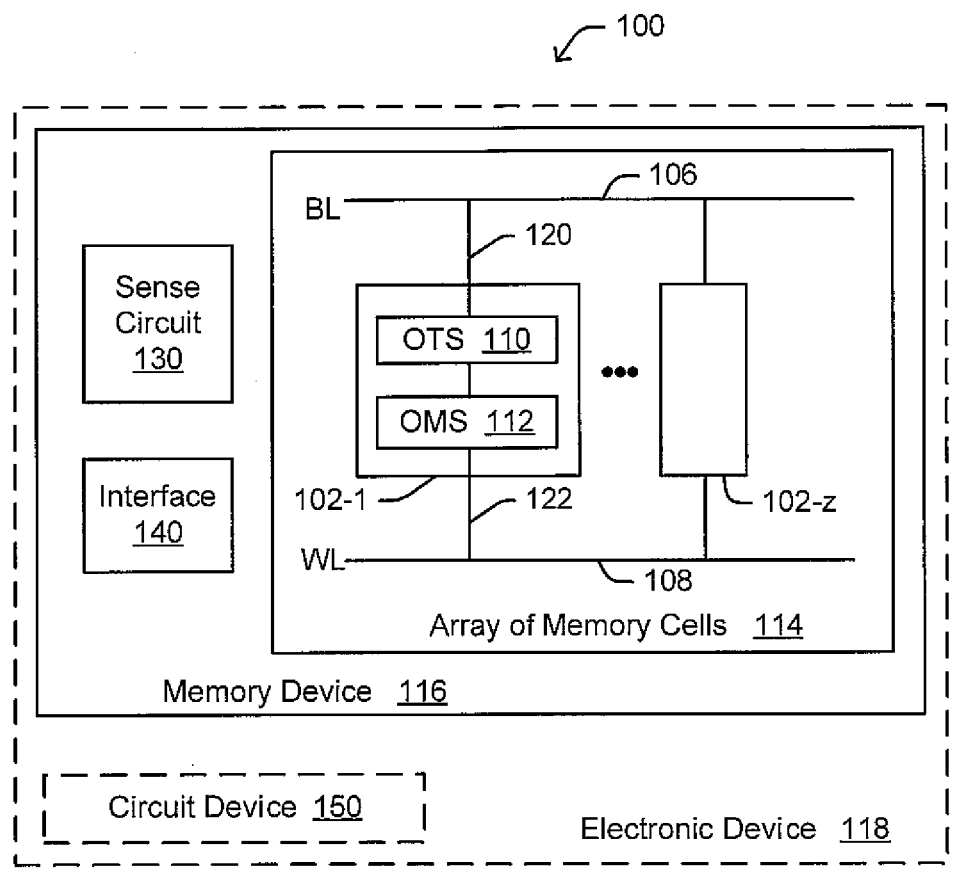
FIG. 1 is a schematic diagram showing an example apparatus comprising an example circuit, according to an implementation.

FIG. 1 is a schematic diagram showing an example apparatus 100 comprising an example memory device 116, according to an implementation. As shown, memory device 116 may be provided as part of, or for use in, an electronic device 118.

Electronic device 118 may represent any electronic device or portion thereof that may access memory device 116, e.g., to transfer one or more electrical signals representing some form of information (e.g., encoded as bits, data, values, elements, symbols, characters, terms, numbers, numerals, or the like). For example, electronic device 118 may comprise a computer, a communication device, a machine, etc., in which memory device 116 may be accessed by a circuit device 150, e.g., via an interface 140. Circuit device 150 may represent any circuitry that may be coupled to memory device 116. Thus, circuit device 150 may comprise some form of a processing circuit (e.g., microprocessor, microcontroller, etc.), some form of a communication circuit (e.g., a receiver, a transmitter, a bus interface, etc.), some form of coding circuit (e.g., an analog to digital converter, a digital to analog converter, an inertial sensor, a camera, a microphone, a display device, etc.), another memory device (e.g., a nonvolatile memory, a storage medium, etc.), and/or a combination thereof, just to name a few examples.

In certain example instances, memory device 116 may be provided as a separate component (e.g., chip, semiconductor die, etc.) which may be coupled to circuit device 150. In certain other instances, a memory device 116 may be provided along with one or more other circuit devices, for example, as part of multiple chip package, one or more semiconductor dies, and/or a system on a chip, just to name a few.

As shown, memory device 116 may, for example, comprise a plurality of memory cells 102-1 through 102-z. For the sake of brevity, in this description, the terms "memory cell 102" or "memory cells 102" may be used as a generic reference to one or more of the plurality of memory cells 102-1 through 102-z. A memory cell 102 may, for example, be selectively programmed in a state representing some form of information, such as, e.g., a binary logic bit (e.g., a "1" or a "0"). In certain example implementations, a memory cell 102 may be capable of being selectively programmed in three or more states, wherein at least one of the states may represent two or more binary logic bits.

In this example, memory cells 102-1 through 102-z are arranged as part of an array of memory cells 114. In certain example implementations, an array of memory cells 114 may be arranged according to a pattern, such as, a connecting grid of bit lines and/or word lines. In certain example implementations, an array of memory cells 114 may comprise a stack (e.g., a multiple layered arrangement) of memory cells 102. In certain example implementations, a memory cell 102 may be accessed using interface 140, e.g., via an applicable bit line node (BL) 106 and word line (WL) node 108.

While the phrases "bit line" and "word line" are used herein, it should be understood that such features are not necessarily intended to be limited to any particular "bit" or "word" arrangement as may be employed in a particular electronic device. Thus, for example, in a more generic sense a "bit line" or a "word line" may be referred to as a "row line" or "column line", or vice versa.

A memory cell 102-1 may, for example, comprise a selection component 110 and a memory component 112. By way of a non-limiting example, as illustrated in FIG. 1, in certain implementations a selection component 110 may comprise an OTS and a memory component 112 may comprise an OMS. Thus, in certain example, implementations, a memory cell 114 may comprise a PCMS memory cell.

As illustrated in FIG. 1, selection component 110 may be coupled in series with memory component 112 and comprise a first node 120 and a second node 122. As shown, first node 120 may, for example, be coupled to bit line (BL) node 106, and as such may be referred to as a "bit line node"; and, second node 122 may, for example, be coupled to a word line (WL) node 108, and as such may be referred to as a "word line node". In certain other example implementations, a memory cell 102-1 may be arranged in an opposite manner such that second node 122 may be a "bit line node" if instead it is coupled to BL node 106, and first node 120 may be a "word line node" if instead it is coupled to WL node 108. It should be understood that in certain implementations, first node 120 or second node 122 may be directly coupled (e.g., via a conducting element) or indirectly coupled (e.g., via one or more other coupled circuit elements) to BL node 106 or WL node 108.

Interface 140 may, for example, be representative of circuitry that allows for access to a memory cell 102. For example, interface 140 may provide for selective reading of one or more memory cells, e.g., in support of a READ operation. For example, interface 140 may provide for selective programming of one or more memory cells, e.g., in support of a WRITE operation. Thus, for example, in certain implementations, interface 140 may receive a program command and in response apply a programming (electric) potential to a memory cell.

In accordance with certain example implementations, a sense circuit 130 may be provided in memory device 116 to determine a state of a memory cell 102. Thus, for example, sense circuit 130 may support one or more memory operations (e.g., a READ operation, a WRITE operation, etc.) via which interface 140 may access a memory cell 102.

Figure 3:
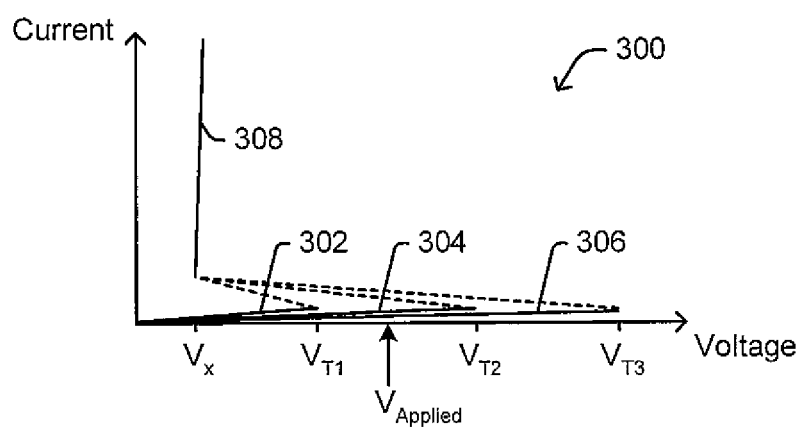
FIG. 3 is a graph illustrating an example snapback event exhibited by an example memory cell, e.g., as in FIG. 2, according to an implementation.

Sense circuit 130 may, for example, be responsive to a snapback event, which may occur in a memory cell 102 under certain conditions. A snapback event may result in a sudden "negative resistance", under certain conditions. While a physical origin of a snapback event may not be completely understood, as illustrated in FIG. 3 and as described in subsequent sections herein, an occurrence a snapback event tends to significantly affect a current-voltage behavior of a memory cell. As such, a sense circuit 130 may, for example, be provided which is responsive to a snapback event occurrence in a memory cell 102 to generate one or more feed back signals that initiate a change in an electric potential being applied to memory cell 102. By way of example, one or more feedback signals may initiate a change in an electric potential to reduce the electric potential, disconnect the electric potential, stop the generation of the electric potential, etc. For example, in certain instances, in response to determining that a snapback event has occurred in a memory cell 102, one or more feedback signals from sense circuit 130 may initiate a change to an electric potential being applied to memory cell 102 by affecting one or more switches which may be used to apply the electric potential to a memory cell 102. Thus, for example, in certain implementations sense circuit 130 may in providing one or more feedback signals reduce an amount of time that a programming (electric) potential may be applied to a memory cell, or reduce the power consumption of a memory cell.

In certain example implementations, a sense circuit 130 may be provided for use with a single memory cell 102. Hence, a plurality of sense circuits may be provided within memory device 116, for example. In certain example implementations, all or part of sense circuit 130 may be provided for use with a plurality of memory cells 102.

Figure 2:
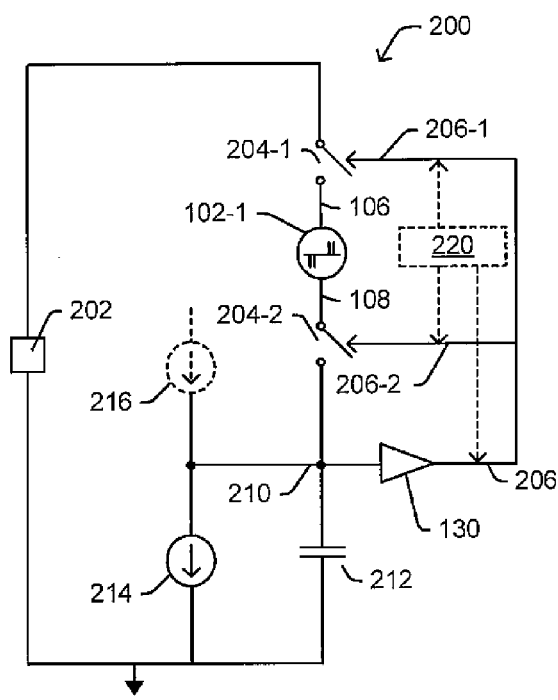
FIG. 2 is a schematic diagram showing an example circuit having a memory cell and sense circuit that may be used in the memory device of FIG. 1, according to an implementation.

Attention is drawn next to FIG. 2, which shows an apparatus 200 that may, for example, be provided within a memory device 116 (FIG. 1).

As shown, apparatus 200 may, for example, comprise a memory cell 102-1 coupled between a first node (e.g., bit line node 106) and a second node (e.g., word line node 108). For example, a first node may be coupled to a switch 204-1 and a second node may be coupled to a switch 204-2. As illustrated, switch 204-1 may, for example, be response to opening and closing based, at least in part, on a signal 206-1, and switch 204-2 may, for example, be response to opening and closing based, at least in part, on a signal 206-2. In certain example implementations, switches 204-1 and 204-2 may be part of a switching circuit 204. In certain example implementations, signals 206-1 and 206-2 may be combined or separate. In certain example implementations, signal 206-1 or signal 206-2 may be generated by a sense circuit 130, e.g., as a feed back signal 206. In certain example implementations, signal 206, signal 206-1, or signal 206-2 may be generated by a controller 220. In certain example implementations, an interface 140 (FIG. 1) may comprise all or part of controller 220 and/or a switching circuit 204.

Closing switches 204-1 and 204-2 completes a circuit path through memory cell 102-1 for an electric potential provided by an electric potential source 202. Thus, an electric potential may, for example, be applied between a bit line node and a word line node of memory cell 102-1 by closing switches 204-1 and 204-2, and changed (e.g., removed) by opening switch 204-1 or switch 204-2. In certain example implementations, an interface 140 (FIG. 1) may comprise all or part of electric potential source 202. Electric potential source 202 may, for example, comprise one or more DC voltage sources, a pulsed voltage source, one or more switched capacitors, etc.

Memory cell 102-1 may, for example, exhibit a snapback event that may be detected in response to an electric potential of an applicable voltage level applied to selection component 110 and PCM 112 (FIG. 1). An occurrence or absence of a snapback event may be indicative of a state of memory cell 102-1.

For example, attention is drawn next to FIG. 3, which is a graph illustrating an example snapback event 300 that may or may not be exhibited by memory cell 102-1 if an applicable voltage level (e.g., $V_{Applied}$) may be applied to selection component 110 and PCM 112 (FIG. 1). In the graph shown in FIG. 3, the horizontal axis depicts an increasing positive voltage level and the vertical axis depicts an increasing positive current level. In this example, $V_{Applied}$ is shown on the horizontal axis as having a voltage level that is between that of a first threshold voltage ($V_{T1}$) which may be associated with a first state possible of memory cell 102-1, and a second threshold voltage ($V_{T2}$) which may be associated with a second possible state of memory cell 102-1. It should be noted that other threshold voltages may exist, e.g., as represented by a third threshold voltage ($V_{T3}$), which may be associated with still other possible states of memory cell 102-1, such as, e.g., in a multi-level cell (MLC) arrangement, etc.

As illustrated by line 302, if memory cell 102-1 is in a first state, in response to application of $V_{Applied}$, a snapback event may occur at $V_{T1}$ which may increase current through memory cell 102-1 (e.g., as illustrated by the jump to line 308). If memory cell 102-1 is in a second state, in response to application of $V_{Applied}$, a snapback event may not occur at $V_{T1}$ (e.g., as illustrated by line 304). However, in other instances, if memory cell 102-1 is in the second state and if $V_{Applied}$ were to exceed $V_{T2}$, a snapback event may occur at $V_{T2}$ which may increase current through memory cell 102-1 (e.g., as illustrated by the jump to line 308). In still other instances, if memory cell 102-1 is in a third state and if $V_{Applied}$ were to exceed $V_{T3}$, a snapback event may occur at $V_{T3}$ (see line 306) which may increase current through memory cell 102-1 (e.g., as illustrated by the jump to line 308). As illustrated, line 308 may be associated with a holding voltage $V_x$.

Snapback event 300 is provided as an example simply to illustrate that one or more snapback event levels may occur under various conditions, and as with all of the examples provided herein, claimed subject matter is not intended to be limited by such examples.

Returning to FIG. 2, sense circuit 130 may, for example, be responsive to a voltage at a sense node 210. As shown in this example, sense node 210 may be coupled to word line node 108 with switch 204-2 closed. Sense node 210 may, for example, be associated with a capacitance represented by capacitor 212. A capacitance may, for example, comprise a parasitic capacitance associated with word line node 108 or the like. Hence, in certain example instances, a capacitance (C) may be of a low level (e.g., less than 300 femtoFarads). If a snapback event occurs, a charge (Q) may be applied at sense node 210. Thus, a sensed voltage level at sense node 210 (e.g., $V_{Sense}$) may, for example, be proportional to a charge (Q) divided by a capacitance (C).

As such, in accordance with certain example implementations, sense circuit 130 may comprise an inverter, a pull-down transistor, a latch, or other like circuit and/or component that, in response to $V_{Sense}$ exceeding a particular threshold voltage level, may generate a feed back signal 206 to initiate a change in an electric potential applied to memory cell 102-1.

In certain example implementations, it may be beneficial for feed back signal 206 to be applied without delay to one or both of switches 204-1 or 204-2 to quickly change (e.g., remove) an electric potential applied to memory cell 102-1. For example, stress to chalcogenic materials or the like, which may be used in memory cell 102-1, may be reduced by reducing an amount of time that an electric potential may be applied to memory cell 102-1. Additionally, reducing an amount of time that an electric potential is applied to memory cell 102-1 may reduce power consumption. Likewise, reducing an amount of time that an electric potential is applied to memory cell 102-1 may increase an operating speed of certain memory operations that access memory cell 102-1.

In accordance with certain example implementations, controller 220 or other like circuit may initiate closing of switches 204-1 and 204-2 to initiate memory cell state sensing, e.g., as part of a memory operation. Controller 220 may subsequently signal one or both switches 204-1 or 204-2 to open. For example, controller 220 may subsequently signal one or both switches 204-1 or 204-2 to open after a period of time has passed since initiating memory cell state sensing. In certain example implementations, one or both of switches 204-1 and 204-2 may be arranged to open after a period of time has passed since being closed. Thus, if a snap back event does not occur during memory cell state sensing, an applied potential may be changed (e.g., removed).

Hence, memory cell state sensing may, for example, identify via a presence or an absence of a feed back signal 206 whether memory cell 102-1 may or may not be in a given state. Thus, for example, controller 220 may monitor or otherwise be affected by feed back signal 206. In certain example instances, as a part of a memory operation, memory cell state sensing may apply a particular potential to memory cell 102-1 and indicate via feed back signal 206 whether memory cell 102-1 may or may not be in a particular state (e.g., based, at least in part, on whether a snapback event was or was not sensed using sense circuit 130).

In certain example implementations, it may be beneficial to couple sense node 210 to a word line node 108 (e.g., as illustrated in FIG. 2) or a bit line node 106 based, at least in part, on capacitances these nodes may exhibit. For example, it may be beneficial to couple sense node 210 to whichever word line node or bit line node exhibits a lower or lowest capacitance, as a magnitude of a voltage at a sense node may be affected by a capacitance exhibited at the sense node.

In certain example implementations, an electrical parameter limiting circuit 214 (e.g., illustrated as a current limiter) may be coupled to sense node 210. Limiting circuit 214 may, for example, be responsive to an electric current that may pass through memory cell 102-1 during memory cell state sensing. For example, limiting circuit 214 may specifically increase a level of impedance associated with sense node 210 in response to an increase in an electric current through memory cell 102-1, e.g., as may occur as a result of a snapback event. Limiting circuit 214 may, for example, momentarily establish a voltage level at sense node 210 that is greater than a threshold sensed voltage level to which sense circuit 130 may respond, e.g., in response to an increase in an electric current through first memory cell 102-1 following a snapback event. In certain example implementations, limiting circuit 214 may, however, respond less to certain leakage currents 216 that may or may not pass around memory cell 102-1 to sense node 210.

Figure 5:
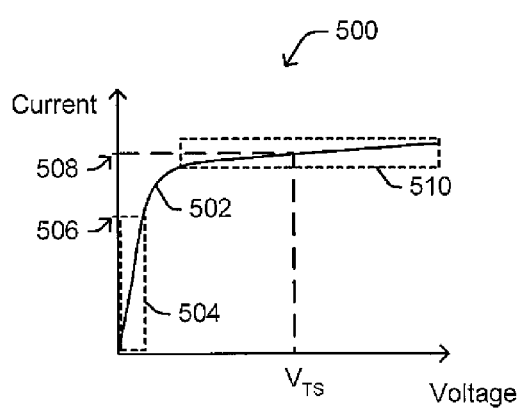
FIG. 5 is a graph illustrating an example non-linear characteristic of a limiting circuit for use with a sense circuit, e.g., as in FIG. 2, according to an implementation.

For example, graph 500 in FIG. 5 illustrates an example non-linear characteristic that may be provided by limiting circuit 214. In graph 500, the horizontal axis depicts an increasing positive voltage level and the vertical axis depicts an increasing positive current level. In this example, a threshold sensed voltage level ($V_{TS}$), e.g., associated with sense circuit 130, is shown on the horizontal axis. In this example, line 502 illustrates an example non-linear characteristic in which leakage current 216 may be generally associated with operating region 504 and have a leakage current threshold level indicated at 506 on the vertical axis. In this example, line 502 also illustrates an example non-linear characteristic in which current that may relate to a snapback event may be generally associated with operating region 510 and have a (limited) current level corresponding to $V_{TS}$ as indicated at 508 on the vertical axis. Of course, as with all of the other examples herein, claimed subject matter is not intended to be limited to this example implementation.

As previously indicated, in certain example implementations, memory cell state sensing may be provided to sense a plurality of different possible states. Hence, it should be understood that electric potential source 202 may be implemented in a variety of ways including an adjustable voltage supply and/or a plurality of different selectable voltage supplies, one or more selectable capacitors pre-charged to adjustable voltages, etc. Further, sense circuit 130 may be implemented in a variety of ways including an adjustable sense circuit and/or a plurality of different selectable sense circuits; and/or limiting circuit 214 may be implemented in a variety of ways including an adjustable limiting circuit and/or a plurality of different selectable limiting circuits. Additionally, it should be understood that all or part of one or more of electric potential source 202, sense circuit 130, or limiting circuit 214 may support memory cell state sensing for a plurality of memory cells. In accordance with certain example implementations, selection and/or application of an electric potential may comprise, at least in part, pre-charging one or more capacitors which may be switched at one or more nodes of a memory cell.

Figure 4:
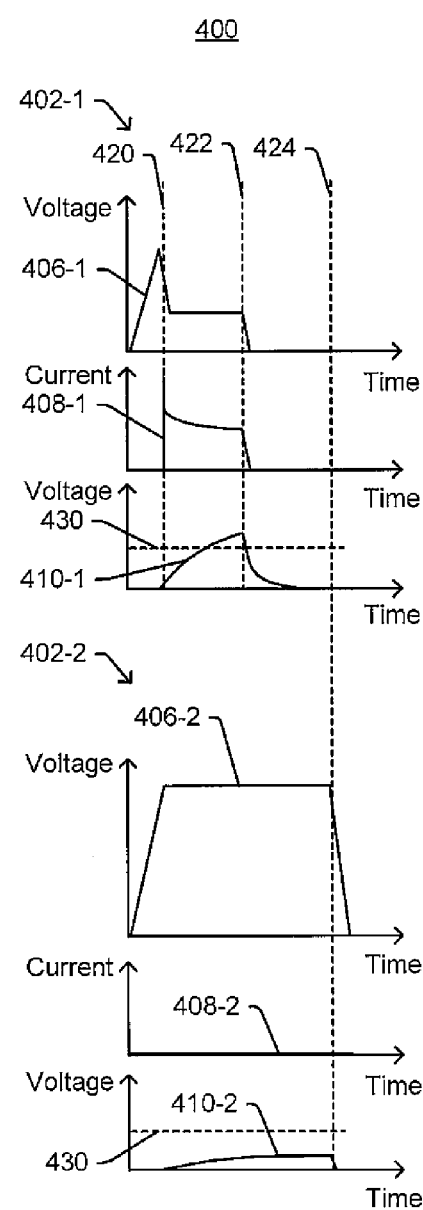
FIG. 4 is a set of graphs illustrating certain example timelines of electrical signals associated with a memory cell and sense circuit, e.g., as in FIG. 2, according to an implementation.

Attention is drawn next to FIG. 4, which is a set of graphs illustrating certain timeline examples of electrical signals associated with memory cell state sensing via example apparatus 200 (FIG. 2). The upper three graphs 402-1 relate to a snapback event occurring during memory cell state sensing. The lower three graphs 402-2 are similar, but relate to a lack of a snapback event occurring during memory cell state sensing.

The horizontal axis in each of the graphs in FIG. 4 depicts an increasing time starting with an initiation of memory cell state sensing at the origin. Additionally, dashed line 420 indicates a time of a snapback event, dashed line 422 indicates a time of a feed back signal 206 being generated, and dashed line 424 indicates an ending of a period of time from the origin. The vertical axis in each graph is labeled as depicting a voltage or a current. The origin in the vertical axis in these examples may or may not equate to a zero voltage or current, respectively.

Hence, in upper graphs 402-1, line 406-1 illustrates, for example, certain changes in a voltage level applied to a memory cell (e.g., a bit line node voltage minus a word line node voltage). Line 408-1 illustrates, for example, certain changes in a current level passing through a memory cell as a result of a snapback event. Line 410-1 illustrates, for example, certain changes in a voltage level at sense node 210 (FIG. 2), which eventually exceeds a threshold sensed voltage level ($V_{TS}$) indicated by dashed line 430.

In lower graphs 402-2 (e.g., wherein no snapback event occurs), line 406-2 illustrates, for example, few changes in a voltage level applied to a memory cell. Line 408-2 illustrates, for example, few changes in a current level passing through a memory cell. Line 410-2 illustrates, for example, minor changes in a voltage level at sense node 210. (FIG. 2), which does not exceed a threshold sensed voltage level indicated by dashed line 430.

Figure 6:
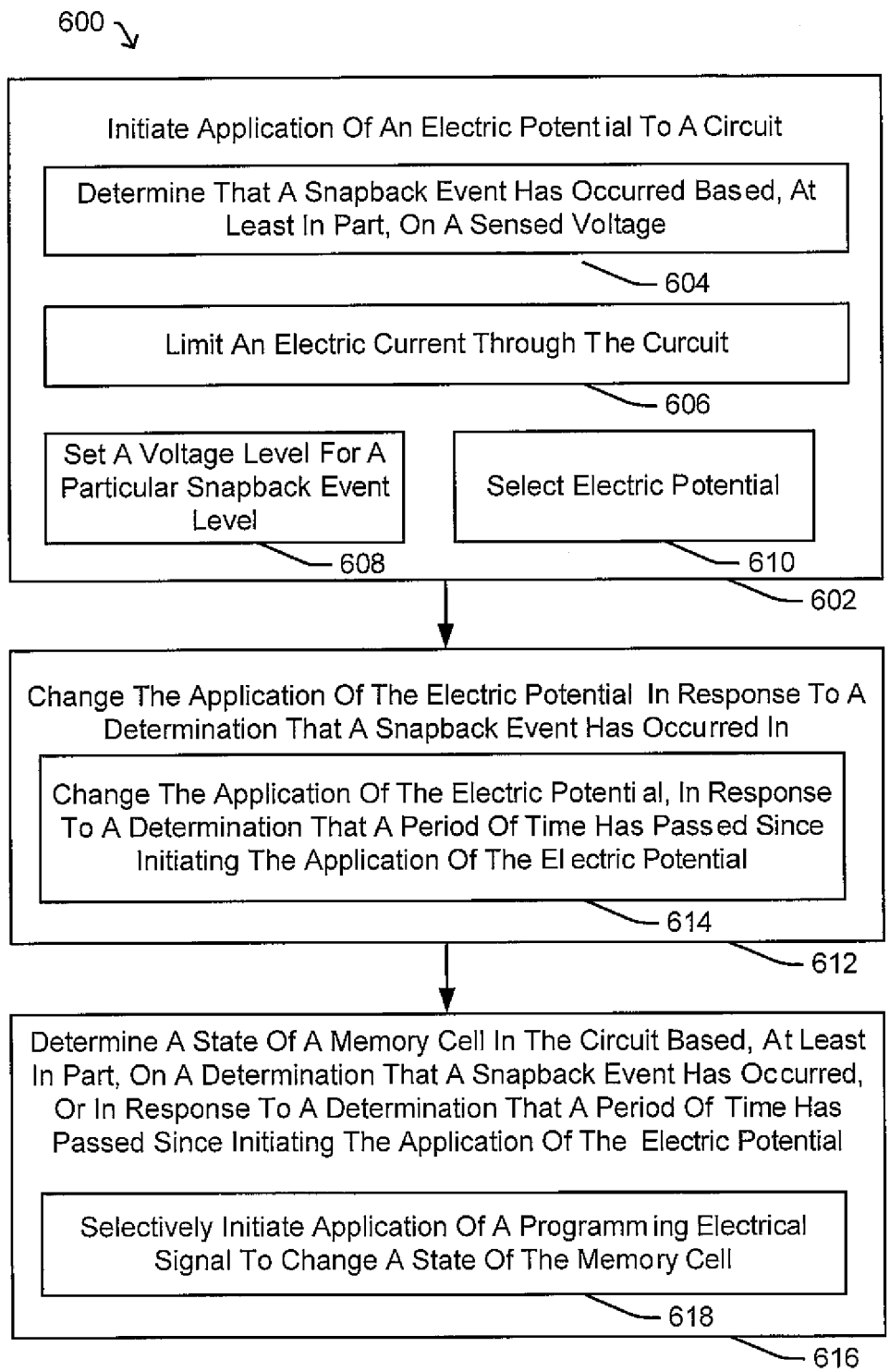
FIG. 6 is a diagram of a method that may be used in the memory device of FIG. 1, according to an implementation.

Attention is drawn next to FIG. 6, which is a flow diagram of a method 600 for use with an example memory device, e.g., as in FIG. 1, to provide or otherwise support memory cell state sensing. Method 600 may, for example, be implemented, at least in part, in various apparatuses or devices, e.g., using various circuits, circuit components, etc.

At example block 602, an electric potential may be applied to a memory cell (e.g., between a first node and a second node). In certain instances, for example at block 604, it may be determined whether a snapback event has occurred based, at least in part, on a sensed voltage at the second node (e.g., a sensed node). In certain instances, for example at block 606, an electrical parameter (e.g., a current) through a memory cell may be selectively limited. In certain instances, for example at block 608, a particular voltage level may be selected and applied to determine if a particular one of several snapback event levels has occurred, e.g., in example implementations wherein a memory cell or like circuit supports a plurality of snapback event levels. In certain instances, for example at block 610, an electric potential may be selected to detect whether a memory cell may or may not be in a particular state, or possibly differentiate between different states.

At example block 612, application of an electric potential may be changed (e.g., removed) in response to a determination that a snapback event has occurred in the memory cell. In certain instances, for example at block 614, application of an electric potential may be subsequently changed (e.g., removed), in response to a determination that a period of time has passed since initiating application of the electric potential.

At example block 616, a state of a memory cell may be determined based, at least in part, on a determination that a snapback event has occurred, or in response to a determination that a period of time has passed since initiating an application of an electric potential. In certain instances, for example at block 618, application of a programming electric signal may be selectively initiated to change a state of a memory cell (e.g., as part of a WRITE operation).

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

Methodologies described herein may be implemented by various mechanisms depending, at least in part, on applications according to particular features or examples. For example, methodologies may be implemented in hardware, firmware, or combinations thereof, along with software. In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other devices units designed to perform functions described herein, analog circuitry, or combinations thereof.

In the preceding detailed description, numerous specific details have been set forth to provide a thorough understanding of claimed subject matter. However, it will be understood by those skilled in the art that claimed subject matter may be practiced without these specific details. In other instances, methods or apparatuses that would be known by one of ordinary skill have not been described in detail so as not to obscure claimed subject matter.

Some portions of the preceding detailed description have been presented in terms of logic, algorithms or symbolic representations of operations on binary states stored within a memory of a specific apparatus or special purpose computing device or platform. In the context of this particular specification, the teim specific apparatus or the like includes a general purpose computer once it is programmed to perform particular functions pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated as electronic signals representing information. It has proven convenient at times, principally for reasons of common usage, to refer to such signals as bits, data, values, elements, symbols, characters, terms, numbers, numerals, information, or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining", "establishing", "obtaining", "identifying", "selecting", "generating", or the like may refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device. In the context of this particular patent application, the term "specific apparatus" may include a general purpose computer once it is programmed to perform particular functions pursuant to instructions from program software.

In some circumstances, operation of a memory device, such as a change in state from a binary one to a binary zero or vice-versa, for example, may comprise a transformation, such as a physical transformation. With particular types of memory devices, a physical transformation may comprise a physical transformation of an article to a different state or thing. For example, but without limitation, for some types of memory devices, a change in state may involve an accumulation or storage of charge or a release of stored charge. Likewise, in other memory devices, a change of state may comprise a physical change or transformation in magnetic orientation or a physical change or transformation in molecular structure, such as from crystalline to amorphous or vice-versa. In still other memory devices, a change in physical state may involve quantum mechanical phenomena, such as, superposition, entanglement, or the like, which may involve quantum bits (qubits), for example. The foregoing is not intended to be an exhaustive list of all examples in which a change in state for a binary one to a binary zero or vice-versa in a memory device may comprise a transformation, such as a physical transformation. Rather, the foregoing are intended as illustrative examples.

A computer-readable (storage) medium typically may be non-transitory or comprise a non-transitory device. In this context, a non-transitory storage medium may include a device that is tangible, meaning that the device has a concrete physical form, although the device may change its physical state. Thus, for example, non-transitory refers to a device remaining tangible despite a change in state. A computer-readable (storage) medium may, for example, be provided for use with an electronic device 118 (FIG. 1), controller 220 (FIG. 2), or with other circuitry of apparatus 100 (FIG. 1).

While there has been illustrated or described what are presently considered to be example features, it will be understood by those skilled in the art that various other modifications may be made, or equivalents may be substituted, without departing from claimed subject matter. Additionally, many modifications may be made to adapt a particular situation to teachings of claimed subject matter without departing from central concept(s) described herein.

Therefore, it is intended that claimed subject matter not be limited to particular examples disclosed, but that claimed subject matter may also include all aspects falling within the possibility of appended claims, or equivalents thereof.

What is claimed is:

1. A method comprising:
    initiating application of an electric potential to a circuit; and
    initiating a change in the application of the electric potential in response to a determination that a snapback event has occurred in the circuit,
    wherein the circuit is capable of producing a plurality of snapback event levels, and
    wherein initiating the application of the electric potential to the circuit further comprises differentiating between the plurality of snapback event levels based, at least in part, by selecting the electric potential for a particular one of the plurality of snapback event levels.

2. A method comprising:
    initiating application of an electric potential to a circuit; and
    initiating a change in the application of the electric potential in response to a determination that a snapback event has occurred in the circuit,
    wherein the circuit is capable of producing a plurality of snapback event levels, and
    wherein initiating the application of the electric potential to the circuit further comprises differentiating between the plurality of snapback event levels based, at least in part, by setting a threshold voltage level for use in determining that a particular one of the plurality of snapback event levels has occurred.

3. The method as recited in claim 1, and further comprising:
    limiting an electric current through the circuit.

4. The method as recited in claim 3, wherein limiting the electric current through the circuit further comprises:
    limiting the electric current to an amount that exceeds a leakage current threshold.

5. The method as recited in claim 1, wherein the circuit comprises a memory cell and further comprising:
    determining a state of the memory cell based, at least in part, on a determination as to whether the snapback event has occurred.

6. The method as recited in claim 5, and further comprising:
    initiating application of a programming electric signal to the memory cell based, at least in part, on the state of the memory cell.

7. The method as recited in claim 1, and further comprising:
    in response to a determination that a period of time has passed since initiating the application of the electric potential, initiating the change in the application of the electric potential.

8. The method as recited in claim 1, wherein the circuit comprises a memory cell and initiating the application of the electric potential further comprises:
    selecting the electric potential based, at least in part, on a particular state of the memory cell to be detected.

9. The method as recited in claim 1, wherein initiating the change in the application of the electrical potential is after the change in the electrical potential resulting from the snapback event.

10. The method as recited in claim 1, wherein initiating the change in the application of the electrical potential comprises stopping the generation of the electrical potential.

11. The method as recited in claim 1, wherein the circuit comprises a memory cell and wherein, when the memory cell is in a first state, the memory cell generates the snapback event in response to the application of the electrical potential.

12. The method as recited in claim 1, wherein the circuit comprises a memory cell and wherein, when the memory cell is in a second state, the memory cell does not generate the snapback event in response to the application of the electrical potential, and wherein the electric potential applied is removed after a period of time has passed.

* * * * *